(12) United States Patent
Heng et al.

(10) Patent No.: US 6,189,132 B1
(45) Date of Patent: Feb. 13, 2001

(54) DESIGN RULE CORRECTION SYSTEM AND METHOD

(75) Inventors: Fook-Luen Heng, Yorktown Heights, NY (US); Zhan Chen, Santa Clara, CA (US); Gustavo E. Tellez, Cornwall on Hudson, NY (US); John Cohn, Richmond, VT (US); Rani Narayan, Hopewell Junction, NY (US)

(73) Assignee: International Business Machines Corporation, Armonk, NY (US)

( * ) Notice: Under 35 U.S.C. 154(b), the term of this patent shall be extended for 0 days.

(21) Appl. No.: 09/057,961

(22) Filed: Apr. 9, 1998

(51) Int. Cl.[7] ................................................. G06F 17/50
(52) U.S. Cl. .................. 716/11; 716/21; 716/4; 716/5; 716/8; 716/9; 716/10
(58) Field of Search .......................... 395/500.12; 716/11

(56) References Cited

U.S. PATENT DOCUMENTS

| | | | |
|---|---|---|---|
| 4,754,408 | * 6/1988 | Carpenter et al. | 364/491 |
| 5,140,402 | * 8/1992 | Murakata | 357/45 |
| 5,359,538 | * 10/1994 | Hui et al. | 364/491 |
| 5,363,313 | * 11/1994 | Lee | 364/491 |
| 5,535,134 | 7/1996 | Cohn et al. . | |
| 5,636,132 | * 6/1997 | Kamdar | 364/491 |

OTHER PUBLICATIONS

J.-F. Lee, Himalayas – A Hierarchical Compaction System with a Minimized Constraint Set, pp. 150–157, Nov. 1992.*

C. -K. Cheng et al., Symbolic Layout Compaction Under Conditional Design Rules, IEEE Transactions on Computer-Aided Design of Integrated Circuits and Systems, pp. 475–486, Apr. 1992.*

Chiu–Sing Choy et al., An Algorithm to Deal With Incremental Layout Alteration, Proceedings of the 34th Midwest Symposium on Circuits and Systems, pp. 850–853, May 1991.*

(List continued on next page.)

*Primary Examiner*—Paul R. Lintz
*Assistant Examiner*—Annette M. Thompson
(74) *Attorney, Agent, or Firm*—F. Chau & Associates, LLP

(57) ABSTRACT

A method of modifying a layout of a plurality of objects in accordance with a plurality of predetermined criteria is presented. An objective function is defined for measuring a location perturbation and a separation perturbation of the objects in the layout. A linear system is defined using linear constraints in terms of design rules and the objective function to describe separations between layout objects. The linear system is solved to simultaneously remove violations of the design rules, and shapes and positions of objects in the layout are modified in accordance with the solution of the linear system such that a total perturbation of the objects in the layout is reduced. A system for implementing the present invention is also presented.

32 Claims, 5 Drawing Sheets

OTHER PUBLICATIONS

Dong, S.K. et al., Constraint Relaxation in Graph–Based Compaction, Proceedings of the 5th ACM/Sigda Physical Design Workshop, pp. 256–261, Apr. 1996.*

Pan, Peichen et al., Optimal Graph constraint reduction for Symbolic Layout Compaction, Proceedings of the 30th International Conference on Design Automation Conference, p. 401, Jan. 1993.*

Y. Z. Liao et al., "An Algorithm to Compact a VLSI Symbolic Layout with Mixed Constraints", IBM Corporation, Thomas J. Watson Research Center, Paper 9.1, pp. 107–112.

John K. Ousterhout, "Corner Stitcing: A Data–Structuring Technique for VLSI Layout Tools", IEEE Transactions on Computer–Aided Design, vol. Cad. 3, No. 1, Jan. 1984, pp. 88–100.

Jin–fuw Lee et al., "A Performance–Aimed Cell Compactor with Automatic Jogs", IEEE Transactions on Computer–Aided Design, vol. 11, No. 12, Dec. 1992, pp. 1495–1507.

Heng et al., "A VLSI Artwork Legalization Technique Based on a New Criterion of Minimum Layout Perturbation" IBM Corporation, T. J. Watson Research Center, pp. 116–121.

* cited by examiner

DESIGN RULE CORRECTION SYSTEM AND METHOD

BACKGROUND OF THE INVENTION

1. Field of the Invention

The present invention relates to object layouts and, more particularly, to a system and method for correcting design rule violations for object layouts in very large scale integrated (VLSI) circuits.

2. Description of the Related Art

Semiconductor chip layout is subject to complex rules governing, among other things, geometry of shapes on process layers. These complex rules may include, for example, width requirements, spacing requirements, overlap requirements, etc. Compliance with these rules, called design rules, is important to chip functionality and manufacturability.

Many conventional processes used to create or alter layouts can introduce design rule violations. Manual layout, for example, inevitably introduces violations due to the difficulty of satisfying a large number of complex design rules by hand. These violations are generally corrected via tedious iterations between design rule checking tool runs and manual layout modifications.

Technology migration is another process which gives rise to a very large number of design rule violations. Migration is the process which transforms layouts in one technology to a layout in a technology with different design rules. The migration process begins with a simple scaling, using commercially available programs, and is sufficient to produce a design-rule-correct layout. In many cases, however, non-scalable differences in the design rules result in the introduction of design rules violations, which must again be corrected by hand by tedious manual iteration.

To date, the only automation technology available to assist in design rule violation correction is compaction. Compaction is a technique used to minimize the area of a layout while satisfying design rules. Design rule violation correction is accomplished as a side effect of the process. The prime objective of minimizing area can cause great disruption to the layout. Critical alignments, inter-net spacing, symmetries, power, performance, etc. can be easily lost in the process. Designers generally find this degree of disruption unacceptable. Though some of the critical features may be preserved by the addition of manual constraints. Adding these constraints is another tedious, error prone process. As a consequence of these limitations, compaction has not found wide use as a design rule correction aid.

Compaction is performed as follows. Compaction includes two steps. The first step includes constraint graph generation and the second includes constrained optimization. Conventional compaction modifies a layout in one direction at a time. For simplicity, compaction is described for a horizontal direction (or x direction in Cartesian coordinates) modification. The same method applies for a vertical direction (or y direction in Cartesian coordinates).

The linear constraints are established which represent the separation between layout elements required by design rules. A constraint based optimization is performed based on a selected objective function which is subject to the system of linear constraints. In conventional compaction, the objective function is a minimum sum of all $X_i$, where $X_i$ is a variable representing the position of an element, subject to the system of linear constraints. Conventional compaction also includes aspects, for example wire length minimization. Further details of compaction are contained in an article by Liao et al. entitled "An Algorithm to Compact a VLSI Symbolic Layout with Mixed Constraints", 20th Design Automation Conference, Miami Beach, Fla., June 1983, pp. 107–112 and an article by Lee et al. entitled "A Performance-Aimed Cell Compactor with Automatic Jogs", IEEE Transaction on Computer Aided Design, VOL. 11, No. 12, December 1992, pp. 1495–1507.

Minimizing the sum of $X_i$'s has the effect of selecting the smallest value of $X_i$ for each edge in the design. This is equivalent to pushing all edges in the design as far to one side as possible which also minimizes area which is unacceptable. Together with a wire length objective, the conventional compaction produces more reasonable results. However, this global minimization often comes with unacceptable perturbation of the original layout.

Therefore, a need exists for a system and method for automatically correcting design rule violations with minimal disruption to the input layout. A further need exists for a system and method for automatically correcting design rule violations during technology migration.

SUMMARY OF THE INVENTION

In accordance with the present invention, a method of modifying a layout of a plurality of objects in accordance with a plurality of predetermined criteria includes the following steps. A step of defining an objective function for measuring a location perturbation and a separation perturbation of the objects in the layout is included. Defining a linear system using linear constraints in terms of design rules and the objective function to describe separations between layout objects is also included. The linear system is solved to simultaneously remove violations of the design rules and shapes and positions of objects in the layout are modified in accordance with the solution of the linear system such that a total perturbation of the objects in the layout is minimized.

In alternate methods of modifying a layout, the step of weighting the location perturbation and the separation perturbation in accordance with predetermined criteria is included. The step of defining the objective function includes defining the objective function for the location perturbation equal to $|X_i - X_i^{old}|$ where $X_i$ is a final location of object i and $X_i^{old}$ is an initial location of object i, and defining the objective function for the separation perturbation equal to $|X_j - X_i - (X_j^{old} - X_i^{old})|$ where $X_j$ is a final location of object j and $X_j^{old}$ is an initial location of object j. The step of defining the system of linear constraints may include the step of defining linear constraints of the form $X_j - X_i \geq d_{ij}$ where $X_j$ is a final location of object j, $X_i$ is a final location of object i and $d_{ij}$ is a relative distance between i and j as defined by design rules. The objective function may be a non-linear function which may be transformed into a linear function by modifying the linear constraints.

The method of modifying the layout may further include the steps of modifying the linear constraints in accordance with user defined design requirements and introducing the design requirements into the linear system to be used to modify the shapes and positions of the objects.

When the layout includes violations, the step of determining a status of the violation may be included wherein the status is keep, remove or ignore the violation. When the status is keep the violation, the step of modifying a linear constraint in the linear system may be included. When linear constraint is of the form $X_j - X_i \geq d_{ij}$ where $X_j$ is a final location of object j, $X_i$ is a final location of object i and $d_{ij}$ is a relative distance between i and j as defined by design rules, the step of modifying the linear constraint to $X_j - X_i \geq X_j^{old} - X_i^{old}$ where $X_i^{old}$ in an initial location of object i, and $X_j^{old}$ is an initial location of object j may be included. If the status is ignore the violation, the step of deleting a linear constraint that is violated may be included. If the status is remove the violation, the step of removing the violation by solving the linear system is performed. When the layout includes violations where no solution exists, the step of relaxing constraints in accordance with a penalty term to improve the layout may be included.

Another method for modifying a layout of a plurality of objects to ensure compliance with a plurality of predetermined rules and design requirements includes determining a weighted perturbation cost, creating a system of linear constraints in accordance with the design rules and the weighted perturbation cost, modifying the system of linear constraints to reflect the design requirements, modifying the system of linear constraints to ignore and keep predetermined violations of the design rules and the design requirements and modifying the layout to remove violations of design rules and design requirements such that a total perturbation of the objects in the layout is minimized.

In alternate methods of modifying the layout, the step of determining a weighted perturbation cost may include the step of weighting the perturbation cost in accordance with a weighted objective function. The objective function may be a non-linear function and the step of transforming the non-linear function to an equivalent linear function by modifying the linear constraints may be included. The objective function may include a location perturbation equal to $|X_i - X_i^{old}|$ where $X_i$ is a final location of object i and $X_i^{old}$ is an initial location of object i, and/or an objective function for a separation perturbation equal to $|X_j - X_i - (X_j^{old} - X_i^{old})|$ where $X_i$ is a final location of object i, $X_i^{old}$ in an initial location of object i, $X_j$ is a final location of object j and $X_j^{old}$ is an initial location of object j. The step of creating the system of linear constraints may include the step of defining linear constraints of the form $X_j - X_i \geq d_{ij}$ where $X_j$ is a final location of object j, $X_i$ is a final location of object i and $d_{ij}$ is a relative distance between i and j as defined by design rules.

In still other methods, the step of modifying the system of linear constraints to ignore and keep predetermined violations includes the step of keeping the linear constraints by modifying the linear constraints to remove the violation. When the linear constraints are kept and of the form $X_j - X_i \geq d_{ij}$ where $X_j$ is a final location of object j, $X_i$ is a final location of object i and $d_{ij}$ is a relative distance between i and j as defined by design rules, the step of modifying the linear constraints to $X_j - X_i \geq X_j^{old} - X_i^{old}$ where $X_i^{old}$ is an initial location of object i, and $X_j^{old}$ is an initial location of object j may be included. The step of modifying the system of linear constraints to ignore and keep predetermined violations may include the step of ignoring the violation by deleting the linear constraint that is violated. When the layout includes violations where no solution exists, the step of relaxing constraints in accordance with a penalty term to improve the layout may be included.

A system for modifying a layout of a plurality of objects in accordance with a plurality of predetermined criteria includes an objective function for measuring a location perturbation and a separation perturbation of the objects in the layout. A system of linear constraints in accordance with design rules and the objective function describes separations between layout objects. Means for solving the linear system and means for modifying shapes and positions of objects in the layout to simultaneously remove violations of the design rules in accordance with the solution of the linear system such that a total perturbation of the objects in the layout is reduced are also included.

In alternate embodiments of the system, a weighting factor for weighting the location perturbation in accordance with predetermined criteria is preferred. The objective function for the location perturbation may be equal to $|X_i - X_i^{old}|$ where $X_i$ is a final location of object i and $X_i^{old}$ is an initial location of object i. The objective function for the separation perturbation may be equal to $|X_j - X_i - (X_j^{old} - X_i^{old})|$ where $X_i$ is a final location of object i, $X_i^{old}$ in an initial location of object i, $X_j$ is a final location of object j and $X_j^{old}$ is an initial location of object j. The linear constraints may include $X_j - X_i \geq d_{ij}$ where $X_j$ is a final location of object j, $X_i$ is a final location of object i and $d_{ij}$ is a relative distance between i and j as defined by design rules. The objective function may be a non-linear function transformed to a linear function by modifying the linear constraints. The linear constraints may include user defined design requirements which are introduced into the linear system to modify the shapes and positions of the objects. The layout may also include control means for addressing predetermined violations according to predefined criteria. The means for modifying may include a processor, and the means for modifying may also include a processor. The system may further include means for relaxing constraints in accordance with a penalty term for objects in the layout where no solution exists.

These and other objects, features and advantages of the present invention will become apparent from the following detailed description of illustrative embodiments thereof, which is to be read in connection with the accompanying drawings.

BRIEF DESCRIPTION OF DRAWINGS

The invention will be described in detail in the following description of preferred embodiments with reference to the following figures wherein.

DETAILED DESCRIPTION OF PREFERRED EMBODIMENTS

The present invention relates to object layouts and, more particularly, to a system and method for correcting design rule violations for object layouts. In a particularly useful embodiment, the system and method of the present invention are applied to layouts of VLSI circuits. The present invention modifies the formulation of the compaction problem to enable use as a design rule correction aid. The modifications include using the invention to automatically provide design assistance in an object layout. The automatic application of the present invention implies little or no interaction by a user once the input criteria is established and entered into the system. The present invention applies the concept of minimum location perturbation as described in U.S. Pat. No. 5,535,134 to Cohn and Heng (Cohn et al.) which is incorporated herein by reference. Cohn et al. creates a violation which is interactively fixed. The formulation in Cohn et al. is only suitable for interactive, sequential type violation removal. The present invention also includes a concept of minimum separation perturbation to the problem of shapes modification. The area minimization objective of compaction of standard shapes is replaced with a new cost function which seeks to minimize the perturbation of the original layout. The invention further includes the ability of compaction to identify and correct design rule violations. As a result, a method of the present invention significantly reduces the amount of layout modifications to correct all design rule violations. This closely models the approach used in manual design rule violation correction, but is much less error prone and far faster. The present invention corrects design violations simultaneously, allowing a more optimal result than sequential manual correction or sequential application of a single error removal method as described in Cohn et al. In addition, a control mechanism is provided that augments constraint based compaction. The control mechanism uses a simple procedural interface to specify design requirements that are described by the design rules.

For purposes of this disclosure, a layout includes a collection of polygons or two-dimensional objects within an assigned layer. A layout element is an edge of a polygon. A layout element may be an instance of an object such as a transistor or a via. During horizontal layout modification, only vertical shape edges are considered. The present disclosure will consider objects having orthogonal edges, that is, squares and rectangular layout elements. The present invention may be extended to non-orthogonal elements, but orthogonal elements will be discussed in this disclosure for simplicity.

Figure 1:
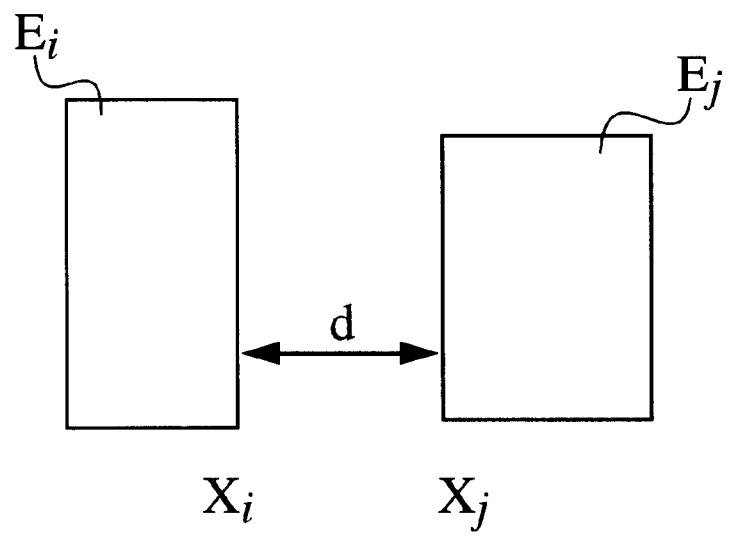
FIG. 1 is a schematic diagram showing a separation between elements.

Referring now in specific detail to the drawings in which like reference numerals identify similar or identical elements throughout the several views and initially to FIG. 1, a position of a layout element $E_i$ is represented by a variable $X_i$. A minimum separation required by a design rule between two layout elements $E_i$ and $E_j$ is represented by a linear constraint of the form $X_j - X_i \geq d_{ij}$. For example, a minimum spacing constraint of d units between edges $E_i$ and $E_j$ is expressed as $X_j - X_i \geq d$ as shown in FIG. 1.

Figure 2:
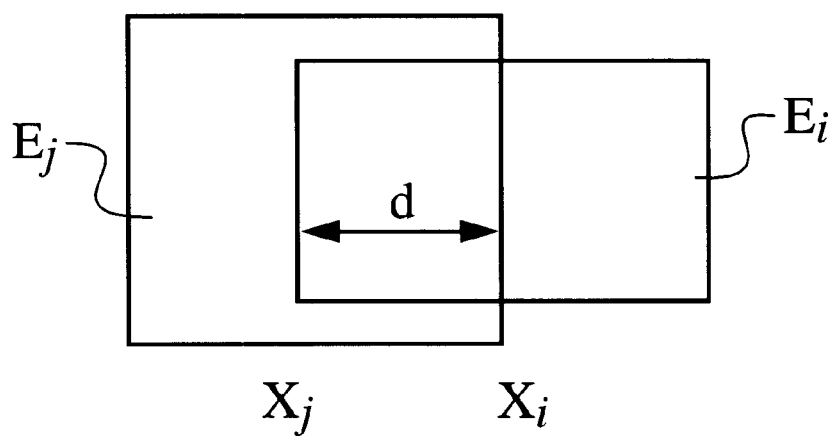
FIG. 2 is a schematic diagram showing an overlap between elements.

Referring to FIG. 2, an overlap constraint of d units between $E_i$ and $E_j$ can be expressed as $X_j - X_i \geq d$. Other constraints such as width, layer coverage, etc. can be composed in a similar fashion as described for the spacing and overlap constraints.

Figure 3:
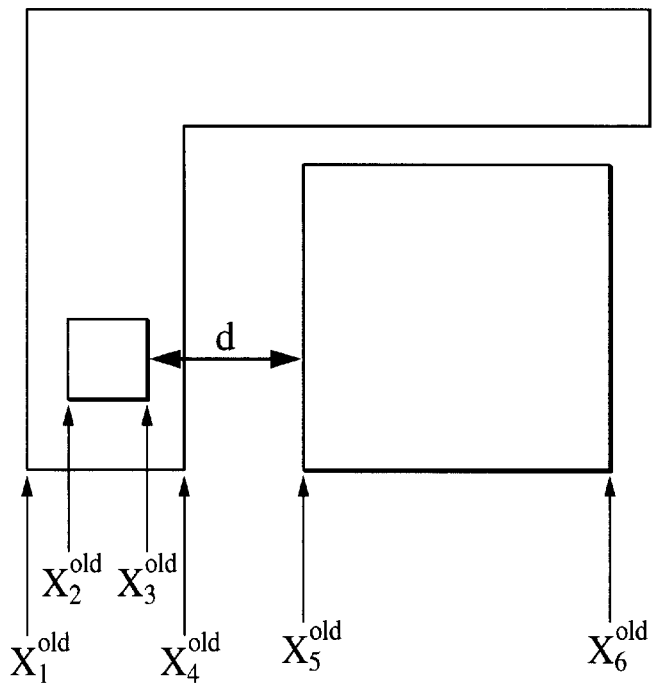
FIG. 3 is a schematic diagram showing an initial layout of objects.
Figure 4:
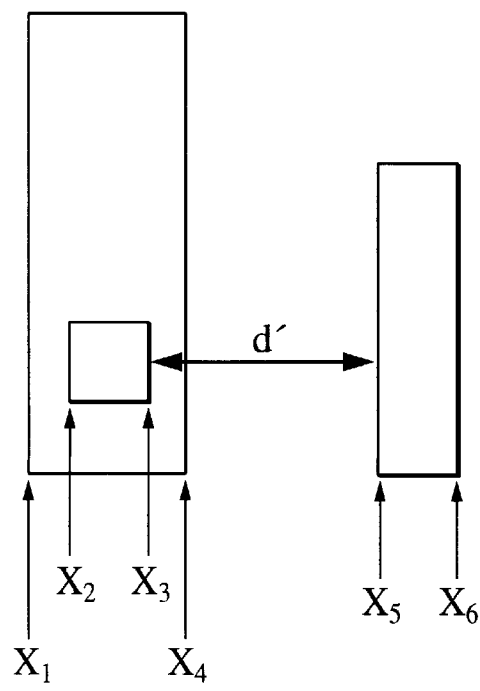
FIG. 4 is a schematic diagram showing results of a conventional compaction process.

Referring to FIG. 3, a graphical example is shown for illustratively demonstrating the present invention. Three objects having six vertical edges are represented by $X_1^{old}$, $X_2^{old}$, $X_3^{old}$, $X_4^{old}$, $X_5^{old}$ and $X_6^{old}$. In this example, a separation, d, between $X_3^{old}$ and $X_5^{old}$ is 4 units apart which does not satisfy the minimum design rule requirement of 6 units. Following conventional compaction, all edges are moved in one direction (left). A separation d' between $X_3^{old}$ and $X_5^{old}$ is spaced at 6 units apart which satisfies the minimum design rule as shown in FIG. 4. However, the separation between other edges are also squeezed to the design rule required minimum. The design rule violation has been removed, but the layout has been drastically perturbed.

The present invention provides an optimization objective function which seeks to minimize the layout perturbation while removing violations. Initial positions of the layout elements are used to define the perturbation of the layout and are used in the objective function. $X_i^{old}$ denotes an initial position of a layout element $E_i$. Perturbation may by categorized into two types in this illustration, a location perturbation and a separation perturbation.

Location perturbation for layout element $E_i$ may be defined as $|X_i - X_i^{old}|$ where $|\ \ |$ indicates absolute value and $X_i$ represents a final position of $E_i$. The location perturbation measures the perturbation of layout element $E_i$ with respect to its initial position. Other distance functions are contemplated including convex distance functions between $X_i$ and $X_i^{old}$, quadratic distance functions $((X_i - X_i^{old})^2$, etc. These other functions achieve equivalent results to that of the absolute value function. However, the absolute value function will be used herein to illustratively demonstrate the invention.

A separation perturbation of a pair of layout elements $E_i$ and $E_j$ may be defined as $|X_j - X_i - (X_j^{old} - X_i^{old})|$. The separation perturbation measures the perturbation of a pair of elements with respect to their initial separation.

A location perturbation objective function in accordance with the present invention is used to optimize the illustrative violation problem as shown in FIG. 3. The objective function is as follows:

$$\text{Minimize } \Sigma\ W_i \times |X_i - X_i^{old}|$$

subject to linear constraints representing design rules;

where $W_i$ is the weight assigned to a layout element $E_i$, wherein the weights are assigned for each design layer or element type in accordance with its importance. For example, layers that are less desired to be moved are assigned a higher weight. The size of a layout element may be represented by its weight. Larger elements (longer shape edges) may also be given higher weight.

Figure 5:
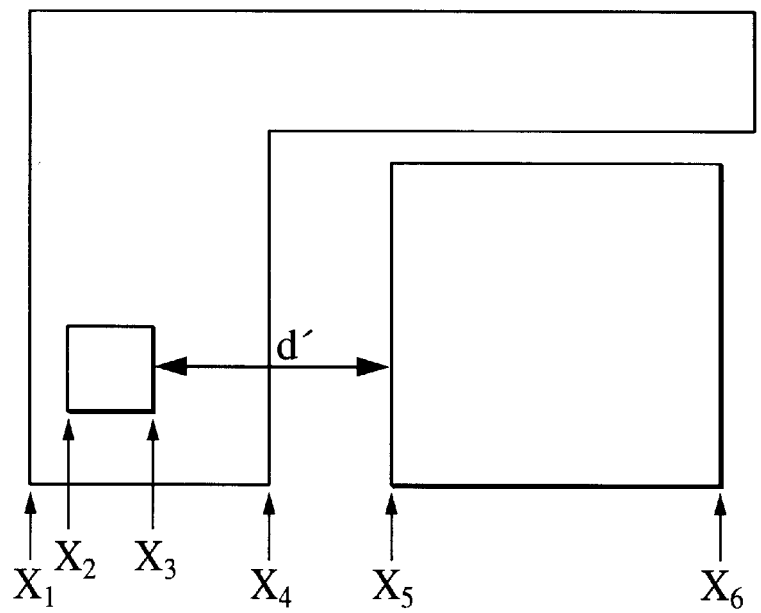
FIG. 5 is a schematic diagram showing a layout after location perturbation in accordance with the present invention.

The optimization result using the location perturbation objective function will appear as shown in FIG. 5. The result after optimization using the present invention satisfies the linear constraint $X_5 - X_3 \geq 6$ and the result is less disruptive than the compaction result shown in FIG. 3. Therefore, the result using location perturbation is more acceptable than conventional compaction.

In a preferred embodiment, separation perturbation is also used. Without separation perturbation, separation between $X_1$ and $X_4$ is widened. If separation perturbation is included in the objective function, a more desirable result may be obtained. The separation perturbation may be calculated as follows:

$$X_4 - X_1 - (X_4^{old} - X_1^{old})|$$

subject to linear constraints representing design rules.

Figure 6:
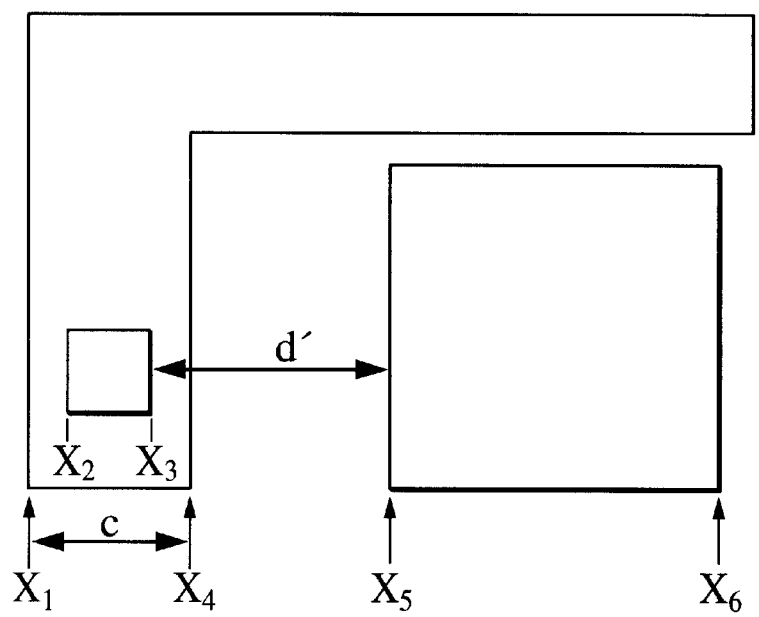
FIG. 6 is a schematic diagram showing a layout after separation perturbation in accordance with the present invention.

Referring to FIG. 6, the result of the separation perturbation is shown. The separation between $X_1$ and $X_4$ is preserved. The separation perturbation can be used to preserve widths of the objects and to preserve spacings between objects of the same or different layers. As can be clearly seen from FIG. 6, the present invention has removed design rule violations while minimally perturbing the initial layout. A distance c is maintained between edges $X_1$ and $X_4$, which is not maintained using conventional compaction.

The objective function, i.e. the absolute value function, may be transformed into a solvable system of linear constraints with a linear objective function. A nonlinear objective function may be transformed into a linear objective function by introducing additional variables and constraints to the original system of linear constraints. Details of the transformation are described in a paper by F. L. Heng et al. entitled "a VLSI Artwork Legalization Technique Based on a New Criteria of Minimum Layout Perturbation", ACM/IEEE Intl. Symp. on Physical Design, pp. 116–121, 1997, (Heng et al.).

For example in Heng et al., a transformation to a linear programming problem is presented. The minimum perturbation objective function can be linearized as follows. Define two variables for each edge $E_i$, namely $L_i$, $R_i$, such that $L_i \leq X_i$, $L_i \leq X_i^{old}$, $R_i \geq X_i$ and $R_i \geq X_i^{old}$. Let $V_L$ denote the set of new variables $L_i$'s and $R_i$'s. Let $A_L$ denotes the set of arcs representing the new constraints. The resulting linearized constraint graph, denoted $G_L$ ($V \cup V_L$, $A \cup A_L$), consists of $3 \cdot |V|$ vertices and $4 \cdot |V| + |A|$ arcs. Then, the following linear programming problem is equivalent to the convex 1D minimum layout perturbation problem:

Linear 1D minimum layout perturbation problem (LMP): Given a layout in the form of a set of edges E with locations $X^{old}$, a constraint graph G(V,A), the problem is to find a set of feasible edge locations X that minimizes the weighted sum:

$$\text{minimize} \sum_{V_i \in V} W_i \cdot (R_i - L_i)$$

$$\text{subject to:} X_j - X_i \geq L_{ij} \forall A_{ij} \in A$$

$$L_i \leq X_i, L_i \leq X_i^{old} \forall V_i \in V$$

$$R_i \geq X_i, R_i \geq X_i^{old} \forall V_i \in V$$

subject to:

$$X_j - X_i \geq L_{ij} \forall A_{ij} \in A$$

$$L_i \leq X_i, L_i \leq X_i^{old} \forall V_i \in V$$

$$R_i \geq X_i, R_i \geq X_i^{old} \forall V_i \in V$$

The equivalence between these two problems can be shown as follows: consider an optimum solution $\{X, L, R\}$ for LMP, where X, L, R denote the sets of values for variables $X_i$'s, $L_i$'s, $R_i$'s respectively. When $X_i \geq X_i^{old}$, $W_i \cdot (R_i - L_i)$ is minimum at $(L_i, R_i) = (X_i^{old}, X_i)$, thus $W_i \cdot |X_i - X_i^{old}| = W_i \cdot (R_i - L_i)$. When $X_i \leq X_i^{old}$, $W_i \cdot (R_i - L_i)$ is minimum at $(L_i, R_i) = (X_i, X_i^{old})$, again $W_i \cdot |X_i - X_i^{old}| = W_i \cdot (R_i - L_i)$. Hence, $X \in \{X, L, R\}$ is a solution for MP with the same cost. Furthermore, for each optimal solution $\{X\}$ of MP, we can construct an equal cost solution for LMP with appropriate L and R as above.

The linear 1D minimum layout perturbation problem in practice must be solved while satisfying additional requirements:

I. The layout coordinates $X_i$ must be integers. This is a practical constraint imposed by the structure of industrial layout databases and manufacturing considerations.

II. Special consideration must be given to layouts where no feasible solution exists to the constraint graph. Producing an infeasible but improved solution is preferable.

Requirement I is handled naturally by the structure of the problem in the case of the absolute value metric. It can be shown that if all $L_{ij}$ and $X_i^{old}$ are integers, then the solution of the linear 1D minimum layout perturbation with graph-based constraints also consists of integers (total unimodularity property). In the case of the eucliean metric, the problem can be made unimodular by converting the quadratic objective function into a piece-wise linear objective, such that the breaks in the objective are all at integer values.

Requirement II implies modifications to the proposed formulation. The problem of handling infeasible problems has been considered previously. It was shown that the problem of minimizing the number of infeasible constraints is NP-complete. The problem is approached by constraint relaxation and minimization of a relaxed objective. We take a similar approach. We relax the arc constraints that are not satisfied initially, such that:

All constraints are feasible.

A penalty is added to the cost function for the region where the original constraints are not satisfied.

The current solution, $X = X^{old}$ is made feasible, but not optional.

We accomplish this by a further transformation of the problem. Let $A_e$ be the set of arcs in A associated with constraints that are not satisfied initially, i.e. $X_j^{old} - X_i^{old} < L_{ij}$. Define a new variable (graph node) $M_i$ for each arc $A_{ij}$ in $A_e$. Let $V_R$ denotes the set of new variables $M_i$'s. Let $A_R$ denote the set of new arcs to be added. We construct a relaxed graph, denoted $G_R(V_R \cup V_L \cup V, A - A_e \cup A_R \cup A_L)$, as follows, Define $D_{ij} = X_j^{old} X_i^{old}$ Let M(i) denote the index of $M_i$ in the vertex set of $G_R$ Add constraints: $X_j - M_i \geq D_{ij}$, $M_i \geq D_{ij}$, $M_i - X_i \geq 0$, and $M_i - X_j \geq -L_{ij}$. The constraints are represented by arcs $A_{m(i)j}$, $A_{iM(i)}$, $A_{jM(i)} \in A_R$ in the relaxed graph.

Let $A_R$ denote the set of arcs $A_{M(i)j}$, i.e. arcs corresponding to constraints $X_j - M_i \geq D_{ij}$ We also set the initial location of the relaxed vertices $M_i^{old} = X_i^{old}$. The minimum layout perturbation with relaxed constraints problem can now be formalized as follows:

Relaxed Linear 1D minimum layout perturbation problem (R-LMP): Given a layout in the form of a set of edges E with locations $X^{old}$, with a set of layout constraints represented by a constraint graph G(V,A), and its corresponding relaxed constraint graph $G_R(V_R \cup V_L \cup V, A - A_e \cup A_R \cup A_L)$, find a set of feasible edge locations X with the objective:

$$\min \sum_{V_i \in V} W_i \cdot (R_i - L_i) + \lambda \cdot \sum_{A_{m(i)j} \in A_R} (M_i - X_j + L_{ij})$$

To see that R-LMP is equivalent to a feasible LMP problem, first note that $X_j - M_i \leq L_{ij}$, and by setting $\lambda > 0$, $(M_i - X_j + L_{ij}) \cdot \lambda$ is minimum at $X_j - M_i = L_{ij}$, making the contribution of the penalty objective equal to 0. If the value $\lambda$ is too small, an infeasible solution could have less cost than a feasible solution. We avoid this problem by choosing $\lambda$ to be greater than $\Sigma W_i$. This way, for each unit of violation reduction, $\Sigma W_i \cdot (R_i - L_i) < \lambda$, therefore the contribution from $(M_i - X_j + L_{ij}) \cdot \lambda$ to the cost function will supersede the penalty contributed by movements of object from its existing position. When the contribution from $(M_i - X_j + L_{ij}) \cdot \lambda$ is minimized to zero, unsatisfied constraints in the initial layout are satisfied. Now consider the case when we have an infeasible LMP problem. The algorithm that solves the R-LMP problem will return a solution which is not feasible in the original problem. However, since this solution is often an improvement over the original layout, it can be further used to make manual layout changes.

The R–LMP problem can be solved by various algorithms. Fast heuristic algorithms can be used to solve this problem; unfortunately, the quality of the solution obtained from these heuristics is unpredictable. A general-purpose linear programming solver, can also be used to solve the problem exactly. However, in this case, the constraint structure of the problem can be exploited to obtain more efficient algorithms. It can be shown that the linear programming dual of this problem is a min-cost network flows problem, thus an exact polynomial time solution exists. In practice, the best solutions of this problem are obtained by exploiting the graph representation of the problem and applying the Simplex algorithm. The resulting algorithm is called the Graph-Based Simplex algorithm (GBS) or Dual Network Simplex method. Use of the present invention provides an effective aid to both manual design and technology migration.

A control mechanism may be included to augment a conventional constraint based compaction modeling input layout. A design rule specifies a minimum separation requirement between a pair of layouts elements. A linear constraint is used to describe the minimum separation requirement to enforce the design rule. The minimum separation requirement between a pair of layout elements may be different from the minimum separation requirement by the design rule, however. For example, a transistor width may need to be scaled by a predetermined percentage. This is accomplished by changing a right hand side of a linear constraint equation to the desired value after the system of linear constraints is created to represent the design rule requirements. For example, if $X_j - X_i \geq d_{ij}$ represents the minimum width requirement of the transistor, but is predetermined that the transistor needs to be scaled by 20% of its current width, then the constraint is modified to:

$$X_j - X_i \geq 1.2 \times (X_j^{old} - X_i^{old}).$$

The initial positions of the layout elements are implemented in accordance with the invention.

In addition to scaling of the design rule value based on the current separation between a pair of layout elements, violations to be removed and violations to be kept may be selectively designated. A violation is a linear constraint that is not satisfied initially. For example, the linear constraint $X_j - X_i \geq d_{ij}$ is a violation if $X_j^{old} - X_i^{old} < d_{ij}$. If a violation $X_j - X_i \geq d_{ij}$ is to be kept, the linear constraint is modified to $X_j - X_i \geq X_j^{old} - X_i^{old}$. If the violation $X_j - X_i \geq d_{ij}$ is to be ignored, the linear constraint is deleted. The remaining violations are violations to be removed by solving the final system of linear constraints such that perturbation is minimized in accordance with the invention.

The control mechanism can be thought of as a post processing step to the system of linear constraints that represents the design rule requirements. The various types of post processing instructions (described above) are provided to the constraint generation via simple procedural interfaces.

Conventional compaction will only give a solution to the linear system. In some cases, the linear system may not have a solution because the linear constraints are not feasible, i.e. cannot all be satisfied, for example, $X_1 - X_2 \geq 1$ and $X_1 - X_2 \leq 0$. In such cases, traditional compaction only reports that the linear system is not feasible, some methods may provide additional analysis to report subsets of constraints that are not consistent. The layout is not modified, however. The present invention provides a feature that "relaxes" the constraints and urges the layout toward an improved solution (i.e with fewer violations) so that further problems may be identified by designers.

Layout constraint relaxation in accordance with he present invention includes handling layouts where no solution exists to all the layouts constraints. Layout constraint relaxation has an additional benefit of providing a very efficient method of computing a starting solution to the problem. A constraint $X_j - X_i \geq d_{ij}$ is given, however a layout is such that an actual distance is less than the that allow by the constraint. Using layout constraint relaxation, a penalty, $(X_j - X_i - d_{ij}) \cdot \lambda$, is introduced for the layout constraint violation. The penalty is such that when the constraint is satisfied the penalty is equal to zero. The present invention therefore adds a penalty term of the larger of $(X_j - X_i - d_{ij}) \cdot \lambda$ or zero to the total minimum perturbation objective function. As a result, the present invention turns the initial layout into an initial solution that satisfies all the layout constraints. Those constraints that cannot be satisfied are transferred into the objective function as penalty terms, and violations are urged toward a best possible placement location. Heng. et al. describes this technique in greater detail.

Figure 7:
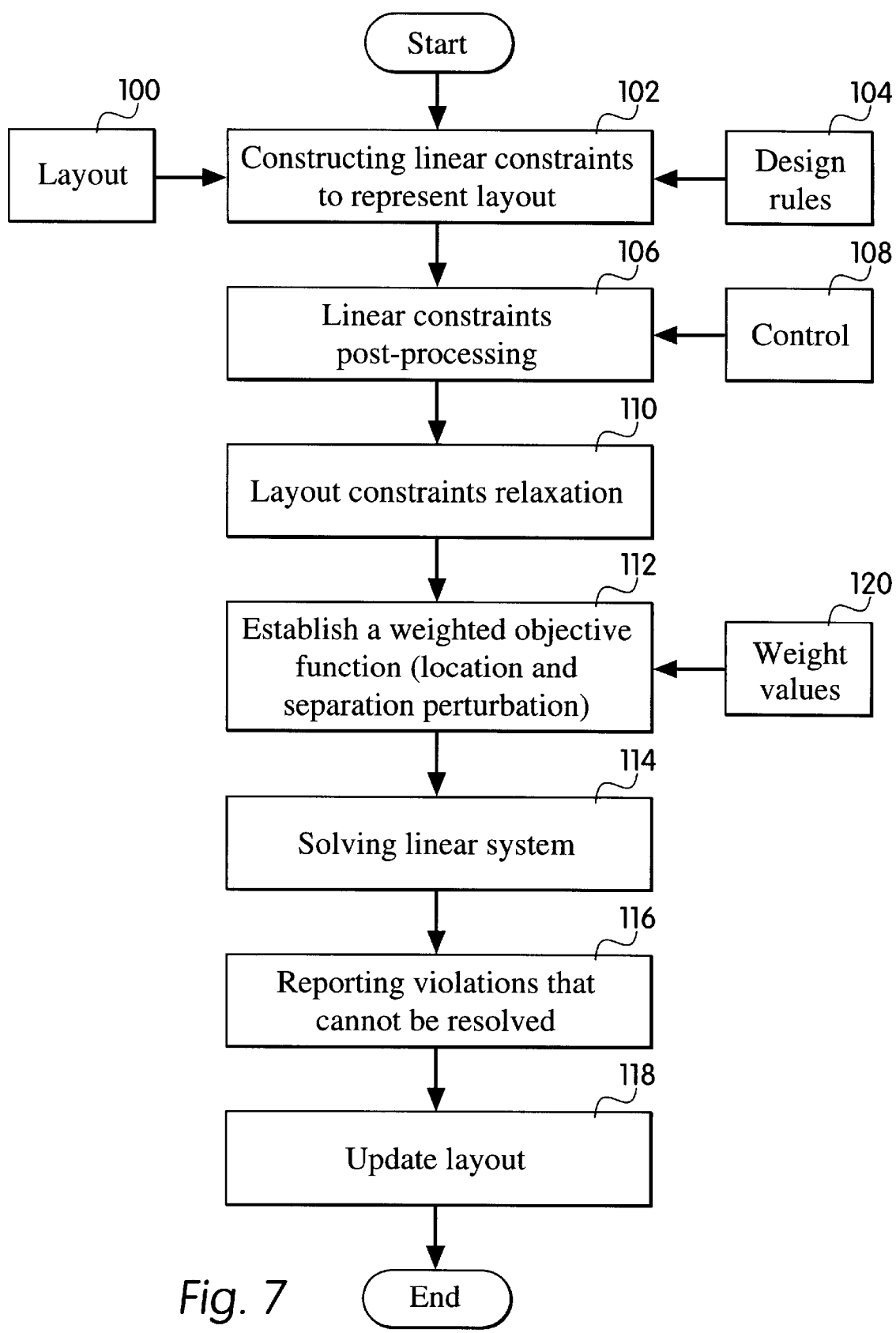
FIG. 7 is a flow/block diagram showing a method/system in accordance with the present invention.
Figure 8:
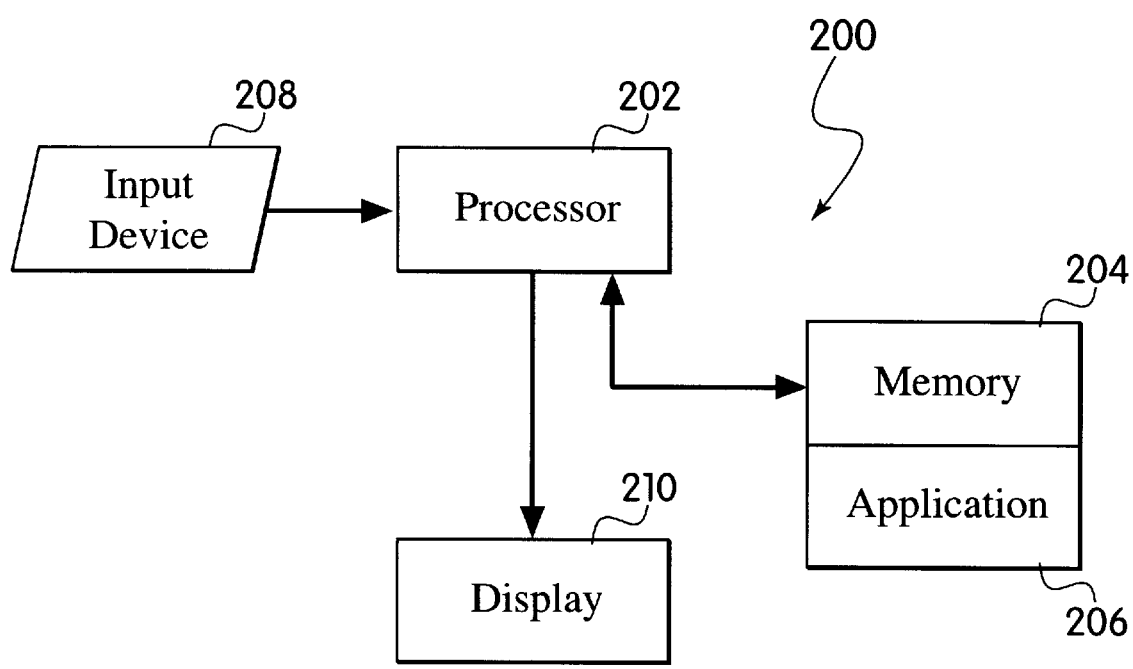
FIG. 8 is a block diagram showing a system for implementing the present invention.

Referring now in specific detail to the drawings, it should be understood that the elements shown in FIGS. 7 and 8 may be implemented in various forms of hardware, software or combinations thereof. Preferably, these elements are implemented in software on one or more appropriately programmed general purpose digital computers having a processor and memory and put/output interfaces. Referring now to FIG. 7, a block/flow diagram is shown for the present invention. A layout of a plurality of objects having predefined positions for at least one layer (and often a plurality of layers) is input from block 100 into block 102. Design rules are input to block 102 form block 104.

In block 102, a system of linear constraints, which describes separations between layout elements on the same or different layers based on design rules, are formulated to be solved. An example of a constraint is $X_j - X_i \geq d_{ij}$.

In block 106, the linear constraints are also modified according to design requirements and violation status criteria by a control mechanism in block 108. If other specifications exist in addition to or replacing design rules than the additional requirements are input to block 106. If other specifications exist as determined by designers, block 106 modifies the linear constraints to accommodate the new constraints. Other specifications may include added design requirements, for example a scaling factor to be added to an object in the layout to achieve a desired property or spacing characteristic. A design rule may specify a minimum separation between a pair of elements which is described in a linear constraint relationship. However, the separation requirement, due to the specification or design requirement, between the pair of objects may be different from the separation required by the design rule. A scaling factor may be added to the linear constraint to provide for the specification change. If, for example, a transistor width needs to be scaled a predetermined percentage of, say 20%, the constraint may be modified to $$X_j - X_i = 1.2 \times (X_j^{old} - X_i^{old}).$$

The system of linear constraints may be modified in accordance with the design requirement. This may be implemented through a computer and assigned variables to the linear constraints.

A violation is a linear constraint that is not satisfied initially, for example the linear constraint $X_j - X_i \geq d_{ij}$ is in violation if $X_j^{old}-X_i^{old}<d_{ij}$. Some violations may not be desirable and others may not pose any issues. The present invention provides a method of keeping, removing or ignoring conditions according to predetermined criteria which are normally in violation of the linear constraints. The designer layout determines which violations are acceptable and which are not. In block 106, if a violation is to be kept, for example $X_j-X_i \geq d_{ij}$, the linear constraint may be modified to remove the violation. In the present example, the linear constraint may be modified to $X_j-X_i \geq X_j^{old}-X_i^{old}$. If a violation is to be ignored, the linear constraint is deleted. If the violation is to be removed, the violation is removed by solving the linear system in block 114 as described below.

In block 110, layout constraint relaxation is performed to relax constraints that are not feasible. A penalty term is created and the larger of $(X_j-X_i-d_{ij})\cdot\lambda$ or zero is added to the total minimum perturbation objective function which is introduced below in block 112. Those constraints that cannot be satisfied are transferred into the objective function as penalty terms, and violations are urged toward a best possible placement location.

In block 112, an objective function is selected and defined to perform the location perturbation measurement. The objective function is preferably an absolute value function as described hereinabove which takes the form of:

$$\text{Minimize } \Sigma\ W_i \times |X_i - X_i^{old}|$$

subject to linear constraints representing design rules. Values for $W_i$ are input from block 120 to block 112. The location perturbations are preferably measured by the equation $|X_i-X_i^{old}|$.

Also in block 112, an objective function is defined for separation perturbation. In a preferred embodiment this function may take the form of:

$$\text{Minimize } \Sigma\ W_i \times |X_j-X_i-(X_j^{old}-X_i^{old})|$$

subject to linear constraints representing design rules. The separation perturbation is determined in block 112 by the objective function with values for $W_i$ input from block 120 to block 112. The system of linear constraints is difficult to solve with a non-linear objective function, such as the absolute value function. Therefore, the non-linear objective function is transformed into a linear objective function by modifying the linear constraints in block 106, thereby creating a solvable linear system. The results are placed into the linear system.

In block 114, the linear system of constraints is solved to simultaneously eliminate violations in the layout. Linear programming or graph based simplex techniques may be used to solve the system. Remaining violations that cannot be resolved are reported in block 116. These violations have a starting solution applied to them by implementing the penalty term to give an improved placement of the objects involved. Further manipulation of the remaining violations may be addressed directly by the user.

The layout is modified in block 118 by implementing the solution of the linear system to provide new locations of elements in the layout. In block 118, modifications are made to the layout in accordance with the design rules after solving the system of linear constraints for the positions of the elements in the layout.

By performing the location and separation perturbations, a layout having minimized perturbation is realized. The violations are simultaneously eliminated by solving the linear system. The method is performed in a first direction, for example in the x direction, and then the method is performed in a second direction orthogonal to the first direction, for example, the y direction. A layout is output in accordance with the present invention which has significantly reduced perturbation and increased automation for the layout determination. The present invention is more versatile, much less error prone and superior to conventional compaction.

Referring to FIG. 8, a block/flow diagram is shown for a system 200 of the present invention. System 200 includes a processor 202 that accesses a memory device 204. Memory device 204 stores an application software package 206 for implementing the present invention. A user interfaces with the processor 202 through an input device 208 which may include a keyboard, a mouse, a touch screen monitor, a voice recognition system or other known input devices. A display 210 is also included to display results, prompts, user inputs, graphics, etc.

Having described preferred embodiments of a novel design rule correction system and method (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A method of modifying a layout of a plurality of objects in accordance with a plurality of predetermined criteria comprising the steps of:

defining objective functions for measuring a location perturbation and a separation perturbation of the objects in the layout;

defining a linear system using linear constraints in terms of design rules and the objective functions to describe separations between layout objects and locations of the layout objects;

solving the linear system to simultaneously remove violations of the design rules; and modifying shapes and positions of objects in the layout in accordance with the solution of the linear system such that a total perturbation of the objects in the layout, including a combination of separation perturbation and location perturbation, is reduced.

2. The method as recited in claim 1, further comprising the step of weighting the location perturbation and the separation perturbation in accordance with predetermined criteria.

3. The method as recited in claim 1, wherein the step of defining the objective function includes defining the objective function for the location perturbation equal to $|X_i-X_i^{old}|$ where $X_i$ is a final location of object i and $X_i^{old}$ is an initial location of object i.

4. The method as recited in claim 1, wherein the step of defining the objective function includes defining the objective function for the separation perturbation equal to $|X_j-X_i-(X_j^{old}-X_i^{old})|$ where $X_i$ is a final location of object i, $X_i^{old}$ in an initial location of object i, $X_j$ is a final location of object j and $X_j^{old}$ is an initial location of object j.

5. The method as recited in claim 1, wherein the step of defining the system of linear constraints includes the step of defining linear constraints of the form $X_j-X_i \geq d_{ij}$ where $X_j$ is a final location of object j, $X_i$ is a final location of object i and $d_{ij}$ is a relative distance between i and j as defined by design rules.

6. The method as recited in claim 1, wherein the objective function is a non-linear function and further comprising the step of transforming the non-linear function to a linear function by modifying the linear constraints.

7. The method as recited in claim 1, further comprising the steps of:
   modifying the linear constraints in accordance with user defined design requirements; and
   introducing the design requirements into the linear system to be used to modify the shapes and positions of the objects.

8. The method as recited in claim 1, wherein the layout includes violations and further comprising the step of determining a status of the violation wherein the status is keep, remove or ignore the violation.

9. The method as recited in claim 8, further comprising the step of modifying a linear constraint in the linear system, when the status is keep the violation.

10. The method as recited in claim 9, wherein the linear constraint is of the form $X_j - X_i \geq d_{ij}$ where $X_j$ is a final location of object j, $X_i$ is a final location of object i and $d_{ij}$ is a relative distance between i and j as defined by design rules and further comprising the step of modifying the linear constraint to $X_j - X_i \geq X_j^{old} - X_i^{old}$ where $X_i^{old}$ in an initial location of object i, and $X_j^{old}$ is an initial location of object j.

11. The method as recited in claim 8, further comprising the step of deleting a linear constraint that is violated, when the status is ignore the violation.

12. The method as recited in claim 8, further comprising the step of removing the violation by solving the linear system, when the status is remove the violation.

13. The method as recited in claim 1, further comprising the step of relaxing constraints in accordance with a penalty term to improve the layout, when the layout includes violations where no solution exists.

14. A method for modifying a layout of a plurality of objects to ensure compliance with a plurality of predetermined rules and design requirements comprising the steps of:
   determining a weighted perturbation cost by providing a weighted objective function, the weighted objective function including a weighted separation perturbation objective function and a weighted location perturbation objective function;
   creating a system of linear constraints in accordance with the design rules and the weighted perturbation cost;
   modifying the system of linear constraints to reflect the design requirements;
   modifying the system of linear constraints to ignore or keep predetermined violations of the design rules and the design requirements; and
   modifying the layout to remove violations of design rules and design requirements such that a total perturbation based on a combination of separation perturbation and location perturbation of the objects in the layout is reduced.

15. The method as recited in claim 14, wherein the objective function is a non-linear function and further comprising the step of transforming the non-linear function to a linear function by modifying the linear constrains.

16. The method as recited in claim 14, further comprising the step of defining the objective function for a location perturbation equal to $|X_i - X_i^{old}|$ where $X_i$ is a final location of object i and $X_i^{old}$ is an initial location of object i.

17. The method as recited in claim 14, further comprising the step defining the objective function for a separation perturbation equal to $|X_j - X_i - (X_j^{old} - X_i^{old})|$ where $X_i$ is a final location of object i, $X_i^{old}$ is an initial location of object i, $X_j$ is a final location of object j and $X_j^{old}$ is an initial location of object j.

18. The method as recited in claim 14, wherein the step of creating the system of linear constraints includes the step of defining linear constraints of the form $X_j - X_i \geq d_{ij}$ where $X_j$ is a final location of object j, $X_i$ is a final location of object i and $d_{ij}$ a relative distance between i and j as defined by design rules.

19. The method as recited in claim 14, wherein the step of modifying the system of linear constraints to ignore or keep predetermined violations includes the step of keeping the linear constraints by modifying the linear constraints to remove the violation.

20. The method as recited in claim 19, wherein the linear constraints are of the form $X_j - X_i \geq d_{ij}$ where $X_j$ is a final location of object j, $X_i$ is a final location of object i and $d_{ij}$ is a relative distance between i and j as defined by design rules and further comprising the step of modifying the linear constraints to $X_j - X_i \geq X_j^{old} - X_i^{old}$ where $X_i^{old}$ in an initial location of object i, and $X_j^{old}$ is an initial location of object j.

21. The method as recited in claim 14, wherein the step of modifying the system of linear constraints to ignore or keep predetermined violations includes the step of ignoring the violation by deleting the linear constraint that is violated.

22. The method as recited in claim 14, further comprising the step of relaxing constraints in accordance with a penalty term to improve the layout, when the layout includes violations where no solution exists.

23. A system for modifying a layout of a plurality of objects in accordance with a plurality of predetermined criteria comprising:
   objective functions for measuring a location perturbation and a separation perturbation of the objects in the layout;
   a system of linear constraints in accordance with design rules and the objective functions for describing separations between layout objects and locations of the layout objects;
   means for solving the linear system to simultaneously remove violations of the design rules; and
   means for modifying shapes and positions of objects in the layout in accordance with the solution of the linear system such that a total perturbation of the objects in the layout, including a combination of separation perturbation and location perturbation, is reduced.

24. The system as recited in claim 23, further comprising a weighting factor for weighting the location perturbation and the separation perturbation in accordance with predetermined criteria.

25. The system as recited in claim 23, wherein the objective function for the location perturbation is equal to $|X_i - X_i^{old}|$ where $X_i$ is a final location of object i and $X_i^{old}$ is an initial location of object i.

26. The system as recited in claim 23, wherein the objective function for the separation perturbation is equal to $|X_j - X_i - (X_j^{old} - X_i^{old})|$ where $X_i$ is a final location of object i, $X_i^{old}$ in an initial location of object i, $X_j$ is a final location of object j and $X_j^{old}$ is an initial location of object j.

27. The system as recited in claim 23, wherein the linear constraints include $X_j - X_i \geq d_{ij}$ where $X_j$ is a final location of object j, $X_i$ is a final location of object i and $d_{ij}$ is a relative distance between i and j as defined by design rules.

28. The system as recited in claim 23, wherein the objective function is a non-linear function transformed to a linear function by modifying the linear constraints.

29. The system as recited in claim 23, wherein the linear constraints include user defined design requirements which are introduced into the linear system to modify the shapes and positions of the objects.

30. The system as recited in claim 23, wherein the layout includes control means for addressing predetermined violations according to predefined criteria.

31. The system as recited in claim 23, wherein the means for modifying includes a processor.

32. The system as recited in claim 23, further comprising means for relaxing constraints in accordance with a penalty term for objects in the layout where no solution exists.

* * * * *